United States Patent [19]

Waitl et al.

[11] Patent Number: 4,940,855
[45] Date of Patent: Jul. 10, 1990

[54] HERMETICALLY TIGHT GLASS-METAL HOUSING FOR SEMICONDUCTOR COMPONENTS AND METHOD FOR PRODUCING SAME

[75] Inventors: Guenther Waitl, Regensburg; Rolf Birkmann, Laaber, both of Fed. Rep. of Germany; Ewald Schmidt, Vienna, Austria

[73] Assignees: Siemens Aktiengesellschaft, Munich, Fed. Rep. of Germany; Electrovac GES.M.B.H., Vienna, Austria

[21] Appl. No.: 246,983

[22] Filed: Sep. 20, 1988

[30] Foreign Application Priority Data

Sep. 23, 1987 [DE] Fed. Rep. of Germany ....... 3732075

[51] Int. Cl.⁵ .............................................. H01L 23/02
[52] U.S. Cl. ...................................... 174/52.5; 29/827
[58] Field of Search .......................... 174/52.5; 357/73; 29/827

[56] References Cited

U.S. PATENT DOCUMENTS

| | | | |
|---|---|---|---|
| 3,203,083 | 8/1965 | Obenhaus | 174/52.5 X |
| 3,244,802 | 4/1966 | Sturtevant et al. | 174/153 G |
| 3,421,203 | 1/1969 | Ullman et al. | 357/73 X |
| 3,535,530 | 10/1970 | Cooper et al. | 174/52.5 X |
| 3,735,213 | 5/1973 | Kansky | 174/52.5 X |
| 3,828,210 | 8/1974 | Livenick et al. | 174/52.5 X |
| 3,857,993 | 12/1974 | Gregory | 174/52.5 X |
| 4,523,218 | 6/1985 | Kato | 174/52.4 X |

*Primary Examiner*—Leo P. Picard
*Assistant Examiner*—David A. Tone
*Attorney, Agent, or Firm*—Herbert L. Lerner; Laurence A. Greenberg

[57] ABSTRACT

A hermetically tight glass-metal housing for semiconductor components and a method for producing the housing includes a base support for a semiconductor component in the form of a conducting strip having an upper portion and being suitable for functioning as a lead frame. A mounting pedestal is disposed at the upper portion of the conducting strip. Electrical contacts are disposed at the upper portion of the conducting strip for electrical connections with the semiconductor component. A metal ring is hermetically tightly sealed to the upper portion of the conducting strip. A metal cap surrounds the semiconductor component and the metal ring forms a connecting element for a tight weld with the metal cap.

11 Claims, 3 Drawing Sheets

HERMETICALLY TIGHT GLASS-METAL HOUSING FOR SEMICONDUCTOR COMPONENTS AND METHOD FOR PRODUCING SAME

The invention relates to a hermetically tight glass-metal housing for semiconductor components fixed on a base support and a method for producing the same.

Hermetically tight metal housings (metal structures) for the encapsulation of electronic semiconductor components or chips, such as diodes and transistors, as well as optoelectronic semiconductor components or chips, such as light-emitting diodes (LEDs), laser diodes (LDs), photodiodes and photo-transistors, are generally known. Heretofore the base supports (base plates) for these housings have been manufactured separately and were stacked into properly manufactured units by means of complicated magazines. During the manufacture of such housings it was necessary to depart from or change the order previously set during some manufacturing steps, in particular during welding and checking.

A further problem with the current constructions is that it is necessary to additionally provide an expensive insulator for those components which are not permitted electrical contact with the housing. In the case of power components, this insulator normally is made of beryllium oxide (BeO). Beryllium oxide is known to be highly toxic and this results in additional environmental problems.

It is accordingly an object of the invention to provide a hermetically tight and in particular potential-free glass-metal housing for semiconductor components and a method of producing the same, which overcomes the hereinafore-mentioned disadvantages of the heretofore-known methods and devices of this general type, which can be produced simply and reliably within a relatively short period of time and which in particular permits cost-effective manufacture in a production line.

With the foregoing and other objects in view there is provided, in accordance with the invention, a hermetically tight glass-metal housing for semiconductor components, comprising a base support for a semiconductor component in the form of a conducting strip having an upper portion and being suitable for functioning as a lead frame, a mounting pedestal disposed at the upper portion of the conducting strip, electrical contacts disposed at the upper portion of the conducting strip for electrical connections with the semiconductor component, a metal ring hermetically tightly sealed to the upper portion of the conducting strip, and a metal cap surrounding the semiconductor component, the metal ring forming a connecting element for a tight weld with the metal cap.

The advantages obtained by means of the invention are in particular also provided by combining the advantages of the currently used "lead frame" assembly and measuring techniques in connection with components having hermetically tight glass-metal housings.

In contrast to current practice, a conducting strip is used as a base strip. This support strip is constructed in such a way that it takes over the lead frame function, forms the electrical connections and contains the mounting pedestal for the chip and the required electrical contacts (bonding contacts).

In accordance with another feature of the invention, the mounting pedestal is in the form of a platform or reflector. This is done in order to satisfy the particular use requirements During the manufacture of the hermetically tight glass-metal housing, a metallic ring is hermetically tightly sealed against the upper portion of the support strip. In accordance with a further feature of the invention, there is provided a glass bead which has two pieces or has a longitudinal slit formed therein and hermetically tightly seals the metal ring to the upper portion of the conducting strip.

This tightly applied metal ring is used as a connecting element with a metal cap. In accordance with an added feature of the invention, there is provided an optical glass window or lens disposed in the metal cap for photo-electronic semiconductor elements or components.

With the objects of the invention in view, there is also provided a method for producing in particular a plurality of hermetically tight glass-metal housings provided with semiconductor components, which comprises providing a base support in the form of a conducting strip having an upper portion and performing a magazine function, forming electrical connections, a mounting pedestal for the semiconductor component and required electrical contacts with the conducting strip, hermetically tightly sealing a metal ring to the upper portion of the conducting strip, and welding a metal cap surrounding the semiconductor component to the metal ring.

Due to the manufacturing technique described herein, the weld bead is not connected with the electrical connecting legs. This necessarily results in a potential-free housing. This advantage may also be used for the partial coating of the surface in the bonding area. Therefore, in accordance with an additional feature of the invention, there is provided a method which comprises coating the surface of the conducting strip in the vicinity of the electrical contacts by applying a layer of a noble metal, such as gold or silver, and coating the surface of remaining metal parts (conducting strip and weld ring) by applying of a metallic layer, such as nickel in a current-free deposition. In contrast to the current techniques there is no requirement for special masks and trays for the selective galvanization.

The final surface can be produced galvanically or by means of dip or hot tin plating or galvanizing on a belt rather than in the form of bulk material, as is currently customary.

Electrical testing of the completed components can also be carried out on a belt. Especially in connection with optical components, this results in a considerably reduced centering effort for optical light measurements.

Other features which are considered as characteristic for the invention are set forth in the appended claims.

Although the invention is illustrated and described herein as embodied in a hermetically tight glass-metal housing for semiconductor components and a method for producing same, it is nevertheless not intended to be limited to the details shown, since various modifications and structural changes may be made therein without departing from the spirit of the invention and within the scope and range of equivalents of the claims.

The construction and method of operation of invention, however, together with additional objects and advantages thereof will be best understood from the following description of specific embodiments when read in connection with the accompanying drawings.

Figure 1:
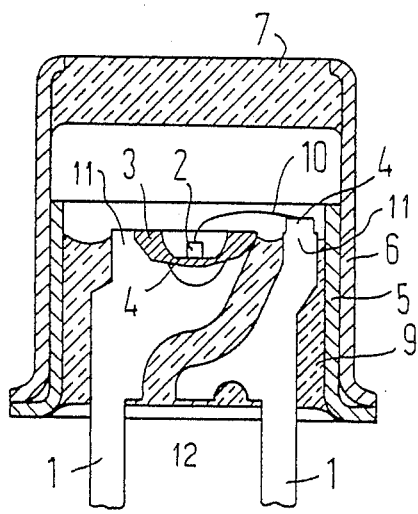
FIG. 1 is a fragmentary, diagrammatic, cross-sectional view of a hermetically tight glass-metal housing for a light-emitting diode in accordance with the invention.
Figure 3:
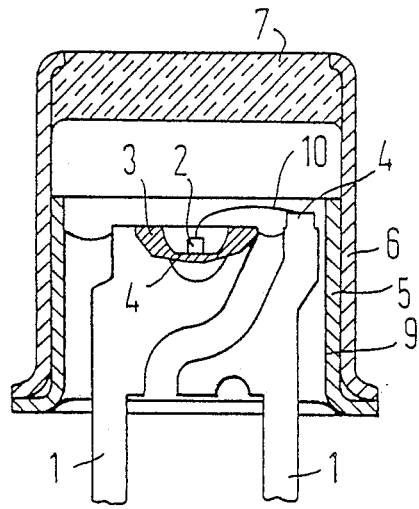
FIG. 3 is a view similar to FIG. 1 showing a two-piece glass bead.
Figure 5:
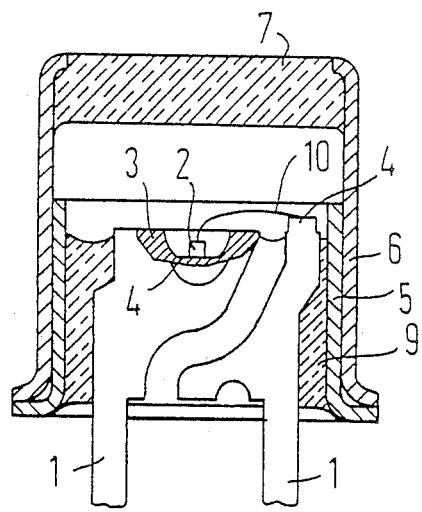
FIG. 5 is a view similar to FIG. 1 showing a glass bead having a longitudinal slit.

Referring now to the figures of the drawings in detail and first, particularly, to FIG. 1 thereof, there is seen a hermetically tight glass-metal housing which is generally formed of a conducting strip 1 as a base support. Vacon, which is a Ni-Fe or Ni-Fe-Co sealing alloy is preferably used as a material for the conducting strip 1. The upper portion of the conducting strip 1, which has two conducting channels having a noble metal layer 11 and a metallic layer 12 in the illustrated embodiment, carries a mounting pedestal 3 for a semiconductor component 2 at an end of one of the conducting channels. In the illustrated embodiment, the semiconductor component 2 is a light-emitting component, namely a light-emitting diode (LED). For this reason, the mounting pedestal 3 in the illustrated embodiment is advantageously in the form of a metallic reflector, to the bottom of which the light-emitting diode is fixed. The conducting strip 1 which serves a mechanical function as a lead frame for manufacture on a production line and which forms an electrical connecting element for the semiconductor component 2, additionally has required contacts 4 in the upper portion thereof at the ends of the two conducting channels. In this illustrated embodiment the transition from the reflector fixed on one conducting channel of the conducting strip 1 to the diode provides one of the contacts 4 and the free end of the upper portion of the other conducting channel of the conducting strip 1 provides the other contact 4. The required connection of the contact 4 on the free end of the upper portion of the other conducting strip 1 to the side of the component (diode) 2 facing away from the mounting pedestal (reflector) 3, is made by means of a bonding wire 10. In the upper portion of the conducting strip 1 a metal ring 5, preferably made of Vacon, is hermetically tightly sealed against the conducting strip 1 by means of a glass bead 9 which is advantageously provided in two parts as shown in FIG. 3 or with a longitudinal slit as seen in FIG. 5 for seating in the metal ring 5 and between the channels of the conducting strip 1. The metal ring 5 provides a connecting element to a metal cap 6 surrounding the semiconductor component 2 and it is fixed on the metal ring 5, preferably by a tight weld. In this illustrated embodiment, in which a light-emitting diode is used as the semiconductor component 2, the metal cap 6 is provided with an optical glass window 7 which is used for the emission from the housing of the light emitted by the diode (semiconductor component 2).

Figure 2:
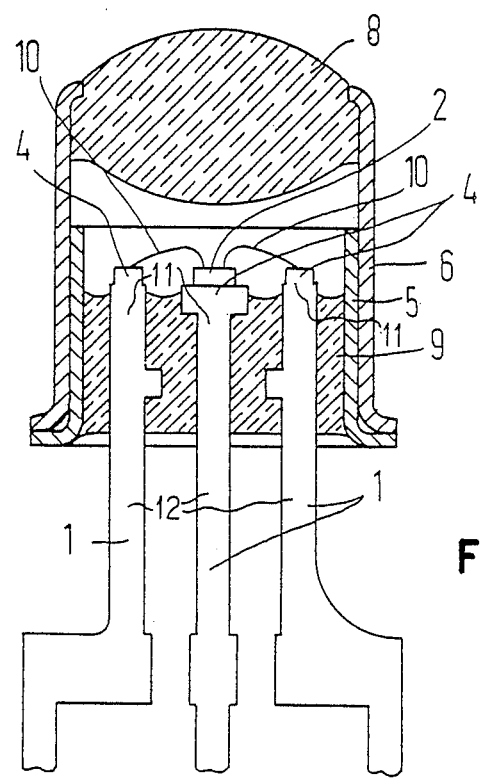
FIG. 2 is a view similar to FIG. 1 of a hermetically tight glass-metal housing for a photo-transistor in accordance with the invention.
Figure 4:
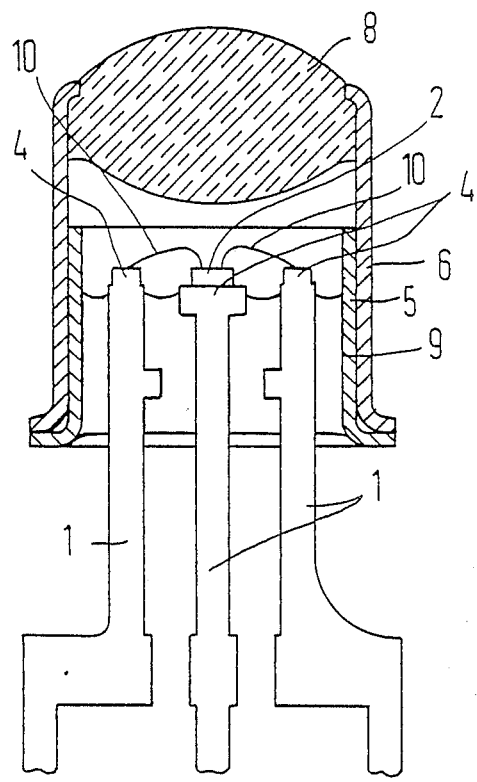
FIG. 4 is a view similar to FIG. 2 showing a tow-piece glass bead.
Figure 6:
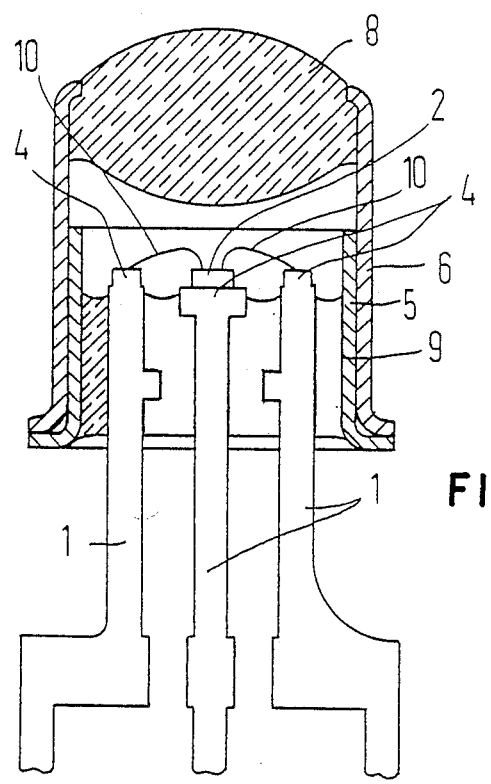
FIG. 6 is a view similar to FIG. 2 showing a glass bead having a longitudinal slit.

The hermetically tight glass-metal housing shown in FIG. 2 is used for the encapsulation of a semiconductor component 2 in the form of a photo-transistor. Since the photo-transistor used in this illustrated embodiment also has a base connection, the conducting strip 1 has three channels in order to provide its required electrical function, besides the mechanical component or contact carrier and lead frame functions. The upper portions of the two outer channels of the conducting strip 1 form the contacts 4 for the emitter and the base contacts of the semiconductor component (photo-transistor) 2. The upper portion of the center conducting channel of the conducting strip 1 provides the electrical contact 4 for the collector as well as the mounting pedestal 3 for the semiconductor component (photo-transistor) 2 and therefore has the shape of a platform. The required electrical connections from the conducting strip 1 to the emitter and to the base of the photo-transistor are made by means of bonding wires 10. The glass bead 9 which may be in two parts as in FIG. 4 or be formed with a longitudinal slit as in FIG. 6 hermetically tightly seals the conducting strip 1 to the metal ring 5 which is used as a connecting element for a tight weld with the metal cap 6 surrounding the semiconductor component 2. In this illustrated embodiment the metal cap 6 is provided with an optical lens 8 which is used for focusing light to be detected by the photo-transistor used as the semiconductor component 2.

We claim:

1. Hermetically tight glass-metal housing for semiconductor components, comprising a base support for a semiconductor component in the form of a conducting strip having an upper portion and being suitable for functioning as a lead frame, a mounting pedestal disposed at said upper portion of said conducting strip, electrical contacts disposed at said upper portion of said conducting strip for electrical connections with the semiconductor component, a metal ring hermetically tightly glass sealed to but electrically isolated from said upper portion of said conducting strip, and a metal cap surrounding said metal ring, said metal ring forming a connecting element for a tight weld with said metal cap.

2. Glass-metal housing according to claim 1, including an optical glass window disposed in said metal cap for photo-electronic semiconductor elements.

3. Glass-metal housing according to claim 1, including a lens disposed in said metal cap for photo-electronic semiconductor elements.

4. Glass-metal housing according to claim 1, wherein said mounting pedestal is in the form of a platform.

5. Glass-metal housing according to claim 1, wherein said mounting pedestal is in the form of a reflector.

6. Method for producing a hermetically tight glass-metal housing provided with a semiconductor component, which comprises providing a base support in the form of a conducting strip having an upper portion and performing a lead frame function, forming electrical connections, a mounting pedestal for the semiconductor component and required electrical contacts with the conducting strip, placing a semiconductor component on the mounting pedestal, connecting the electrical connections to the semiconductor component, electrically isolating and hermetically tightly glass sealing a metal ring to the upper portion of the conducting strip, and welding a metal cap surrounding the semiconductor component to the metal ring.

7. Method according to claim 6, which comprises coating the surface of the conducting strip in the vicinity of the electrical contacts by applying a layer of a noble metal, and coating the surface of remaining metal parts by applying of a metallic layer.

8. Method according to claim 7, which comprises selecting the noble metal from the group consisting of gold and silver.

9. Method according to claim 7, which comprises selecting nickel as the metallic layer.

10. Method according to claim 6, which comprises hermetically tightly sealing the metal ring to the upper portion of the conducting strip with a two-piece glass bead.

11. Method according to claim 6, which comprises hermetically tightly sealing the metal ring to the upper portion of the conducting strip with a glass bead having a longitudinal slit formed therein.

* * * * *